(12) United States Patent
Englekirk (10) Patent No.: US 12,237,835 B2
(45) Date of Patent: Feb. 25, 2025

(54) PIN DETERMINATION FOR SINGLE-CONDUCTOR INTERFACE

(71) Applicant: Murata Manufacturing Co., Ltd., Kyoto (JP)

(72) Inventor: Robert Mark Englekirk, Littleton, CO (US)

(73) Assignee: Murata Manufacturing Co., Ltd., Kyoto (JP)

( * ) Notice: Subject to any disclaimer, the term of this patent is extended or adjusted under 35 U.S.C. 154(b) by 588 days.

(21) Appl. No.: 17/667,027

(22) Filed: Feb. 8, 2022

(65) Prior Publication Data

US 2023/0253960 A1 Aug. 10, 2023

(51) Int. Cl.
| | |
|---|---|
| *H03K 3/037* | (2006.01) |
| *G06F 1/26* | (2006.01) |
| *H03K 17/082* | (2006.01) |
| *H04L 12/10* | (2006.01) |

(52) U.S. Cl.
CPC .............. *H03K 3/037* (2013.01); *G06F 1/266* (2013.01); *H03K 17/0822* (2013.01); *H04L 12/10* (2013.01)

(58) Field of Classification Search
CPC .......... H04L 12/10; H03K 3/037; G06F 1/266
See application file for complete search history.

(56) References Cited

U.S. PATENT DOCUMENTS

| | | | |
|---|---|---|---|
| 11,163,347 B2 * | 11/2021 | Saes | .................... G06F 13/4022 |
| 11,894,840 B2 * | 2/2024 | Englekirk | ............ H03K 17/693 |
| 2015/0074306 A1 | 3/2015 | Ayyagari et al. | |
| 2016/0054777 A1 | 2/2016 | Dwelley et al. | |
| 2017/0039402 A1 * | 2/2017 | Iannotti | .............. G01M 11/0228 |
| 2020/0219522 A1 | 7/2020 | Lesso et al. | |
| 2022/0390998 A1 * | 12/2022 | Wee | ..................... G06F 13/4072 |

FOREIGN PATENT DOCUMENTS

| | | |
|---|---|---|
| KR | 10-2017-0024223 | 3/2017 |
| KR | 10-2021-0099325 | 8/2021 |

OTHER PUBLICATIONS

EP 21177310.6. Jun. 2, 2021. (Year: 2021).*

(Continued)

*Primary Examiner* — Jared Fureman
*Assistant Examiner* — Christopher J Clark
(74) *Attorney, Agent, or Firm* — Steinfl + Bruno LLP (57) ABSTRACT

Circuits and methods for determining the characteristics of swappable pins in a peripheral in a 1-Wire or similar single-conductor system, thereby allowing each one of two pins to be either an I/O pin (connected to an I/O line) or a CAP pin (connected to a storage capacitor). Embodiments preform the following functions: detecting the initial phase of device startup; determining which of pins A and B is coupled to an I/O line (and thus is the I/O pin), and which is coupled to the storage capacitor (and thus is the CAP pin); and generating a flag signal indicating that determination to other circuitry within the peripheral. Detection of pin characteristics is determined at device startup by latching the fastest rising signal on pins A and B, flagging that signal line as being the I/O line, and preventing further changes to the latch output until the next startup cycle.

22 Claims, 7 Drawing Sheets

(56) References Cited

OTHER PUBLICATIONS

Maxim Integrated, "1-Wire Extended Network Standard", Application Note 3925, Oct. 26, 2006, 5 pgs.
Maxim Integrated, "Overview of 1-Wire Technology and Its Use", Tutorial 1796, Jun. 19, 2008, 13 pgs.
Byun, Sung Cheal, International Search Report and Written Opinion received from the KIPO dated May 23, 2023 for appln. no. PCT.US2023/061648, 10 pgs.

* cited by examiner

PIN DETERMINATION FOR SINGLE-CONDUCTOR INTERFACE

BACKGROUND

(1) Technical Field

This invention relates to electronic circuits, and more particularly to electronic circuits interconnected by a serial communications bus.

(2) Background

1-Wire® is a known device communications bus architecture and protocol that provides data, signaling, and power over a single conductor (despite the "1-Wire" name, all devices must also have a ground connection to permit a return current to flow through the data wire). 1-Wire is a voltage-based digital system that provides half-duplex bidirectional communication. With only two contacts, 1-Wire devices are a very economical way to add electronic functionality to non-electronic objects for identification, authentication, and delivery of calibration data, manufacturing information, sensor output data, and other information.

Figure 1A:
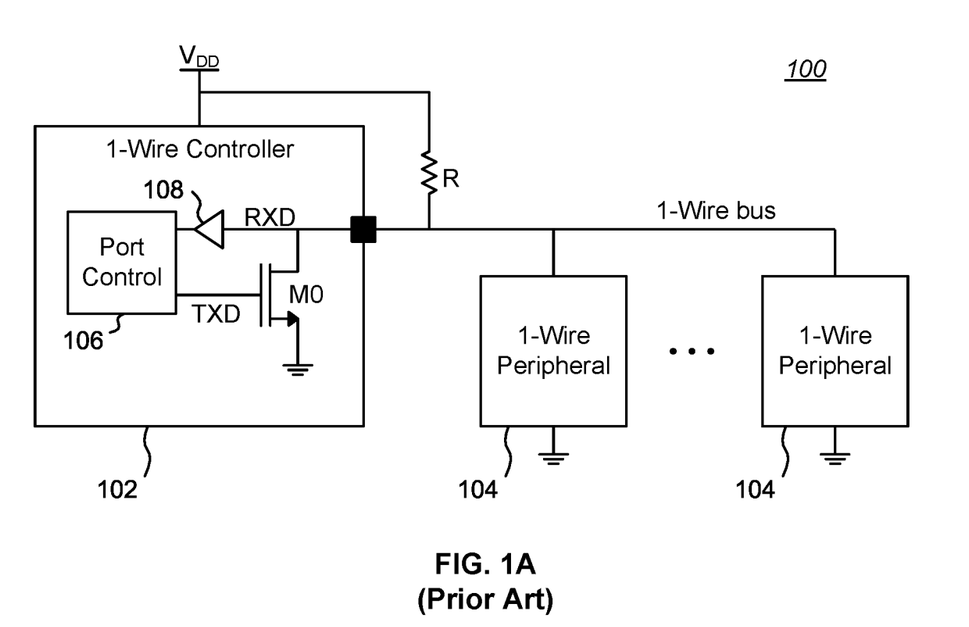
FIG. 1A is a block diagram of an example 1-Wire system.

FIG. 1A is a block diagram of an example 1-Wire system 100. A 1-Wire controller 102 initiates and controls communication with one or more 1-Wire peripherals 104 on a 1-Wire bus. A typical controller 102 includes a Port Control circuit 106 that receives data (RXD) through a buffer 108 and transmits commands and data (TXD) through an open-drain transistor M0, preferably an N-type MOSFET (NFET). It this example, the drain of the NFET is connected to ground when a high voltage (logic 1) is applied to the gate of the NFET device M0. When a low voltage (logic 0) is applied to the gate of the NFET, the drain of the NFET presents a high impedance, and a pull-up resistor R (e.g., 4.7 kΩ) connected to a positive voltage supply $V_{DD}$ (e.g., 3V) provides a voltage near $V_{DD}$ on the 1-Wire bus.

Figure 1B:
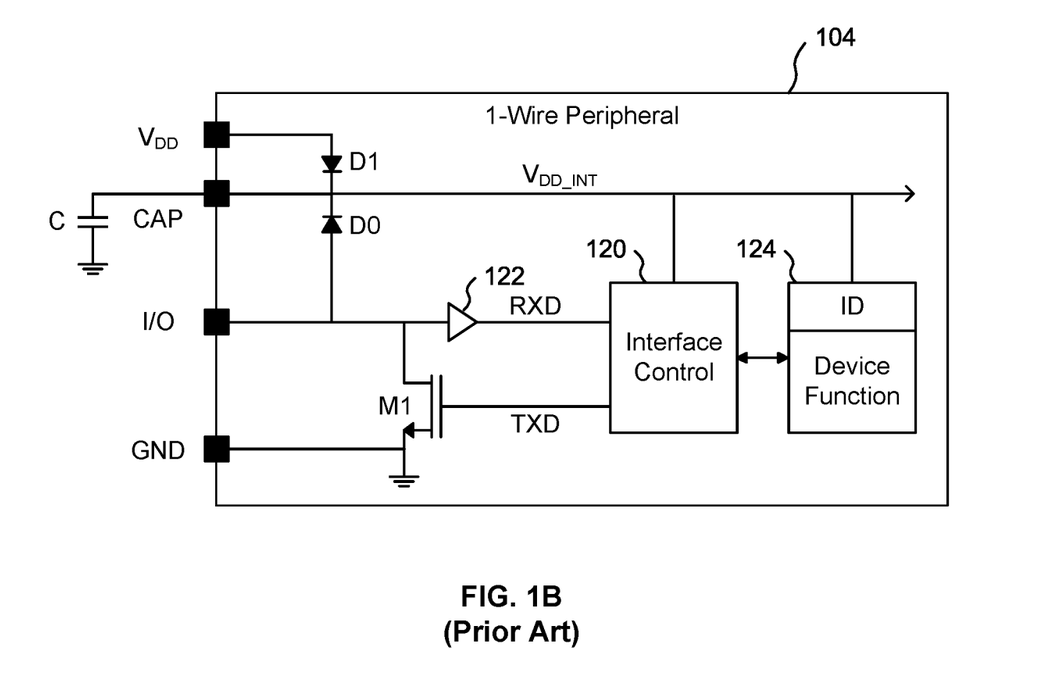
FIG. 1B is a block diagram showing a 1-Wire peripheral in greater detail.

FIG. 1B is a block diagram showing a 1-Wire peripheral 104 in greater detail. In many applications, the voltage source may be a "parasitic" type comprising a diode D0 coupled to the 1-Wire bus. The diode D0 supplies voltage from the 1-Wire bus to a storage capacitor C coupled between circuit ground and an internal power bus $V_{DD\_INT}$. The diode/capacitor parasitic power supply allows a peripheral 104 to operate for some amount of time even when the 1-Wire bus is pulled to ground. In the illustrated example, the storage capacitor C is external to the peripheral 104, coupled to a CAP terminal or "pin" (in some ultra-low power applications, the storage capacitor C may be internal to the peripheral 104). In any case, when command transmission begins on the 1-Wire bus, storage capacitor C charging is halted, and commands are interpreted in known manner. When a command sequence is over, the storage capacitor C resumes charging.

In some applications, a $V_{DD}$ pin may be coupled to a non-parasitic external voltage source to provide power to internal components to an internal power bus $V_{DD\_INT}$; in the illustrated example, the connection of the $V_{DD}$ pin to the internal power bus $V_{DD\_INT}$ is through a diode D1.

A typical peripheral 104 includes an Interface Control circuit 120 that receives data (RXD) from the 1-Wire bus through an input/output (I/O) pin coupled to a buffer 122 (which may include a Schmitt trigger) and transmits commands and data (TXD) to the 1-Wire bus through an open-drain transistor M1 (e.g., an NFET) coupled to the I/O pin. The Interface Control circuit 120 passes data and commands to a Device Function 124 that includes a unique identification (ID) number. The Device Function 124 may perform a variety of functions, such as sensing humidity and/or temperature, storing local data representing monetary amounts (e.g., for use with transit services or vending machines), and/or serving as a personal or item identifier. A ground pin GND provides a reference potential (circuit ground) and return path to the controller 102, Communication commences when a controller 102 or peripheral 104 briefly pulls the 1-Wire bus low (e.g., connects the pull-up resistor R to ground through its respective output NFET Mx) according to a defined protocol. The 1-Wire bus is high when idle, and thus can also power a limited number of peripherals 104. The 1-Wire bus is considered idle when no device (controller or remote) is pulling the 1-Wire bus to ground, and therefore, the 1-Wire bus will be at a logic 1 state, at or near $V_{DD}$. When any device pulls the 1-Wire bus to ground, the 1-Wire will be in a logic 0 state. During idle time, all peripherals 104 will see $V_{DD\_INT}$ and accordingly the storage capacitor C of any associated parasitic power supply will charge.

SUMMARY

Usage of the 1-Wire communications bus architecture has increased since its introduction, which has spurred demand for greater flexibility in using the technology. The present invention addresses that demand by encompassing circuits and methods for determining the characteristics of swappable pins in a peripheral in a 1-Wire or similar single-conductor system, thereby allowing each one of two pins to be either an I/O pin (connected to an I/O line like the 1-Wire bus) or a CAP pin (connected to a line coupled to a storage capacitor C).

Allowing the I/O and CAP pins to be swappable provides for greater flexibility in laying out printed circuit boards (PCBs) and circuit modules. For example, it is sometimes beneficial in laying out PCBs and circuit modules to use "left-handed" and "right-handed" versions of the same part in order to reduce area and/or coupling. However, it is undesirable to have two versions of a part just to satisfy that criterion. A single integrated circuit chip having suitably-positioned swappable pins may be used as either a left-handed or a right-handed component.

Another advantage of having swappable I/O and CAP pins is that detection of each possible configuration allows use of two different device IDs for a 1-Wire system peripheral, thereby enabling the possibility of different behavior as a function of pin connections. Changing the ID of a part allows two otherwise identical parts to be differentiated in serial communications.

Embodiments of the present invention perform the following functions: detecting the initial phase of device startup; determining which of pins A and B is coupled to an I/O line like the 1-Wire bus (and thus is the I/O pin), and which of pins A and B is coupled to the storage capacitor C (and thus is the CAP pin); and generating a flag signal indicating that determination, which may be used by other circuitry within the peripheral. Detection of pin characteristics is determined at device startup by latching a logic signal to represent the fastest rising signal on the lines (I/O and CAP) coupled to pins A and B, flagging that latched signal line as being the I/O line, and preventing further changes to the latch output until the next startup cycle.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements if the context requires.

DETAILED DESCRIPTION

Usage of the 1-Wire communications bus architecture has increased since its introduction, which has spurred demand for greater flexibility in using the technology. The present invention addresses that demand by encompassing circuits and methods for determining the characteristics of swappable pins in a peripheral in a 1-Wire or similar single-conductor system, thereby allowing each one of two pins to be either an I/O pin (connected to an I/O line like the 1-Wire bus) or a CAP pin (connected to a line coupled to an external storage capacitor C).

Allowing the I/O and CAP pins to be swappable provides for greater flexibility in laying out printed circuit boards (PCBs) and circuit modules. For example, it is sometimes beneficial in laying out PCBs and circuit modules to use "left-handed" and "right-handed" versions of the same part in order to reduce area and/or coupling. However, it is undesirable to have two versions of a part just to satisfy that criterion. A single integrated circuit chip having suitably-positioned swappable pins could be used as either a left-handed or a right-handed component.

Another advantage of having swappable I/O and CAP pins is that detection of each possible configuration allows use of two different device IDs for a 1-Wire system peripheral, thereby enabling the possibility of different behavior as a function of pin connections. Changing the ID of a part allows two otherwise identical parts to be differentiated in serial communications.

Figure 2:
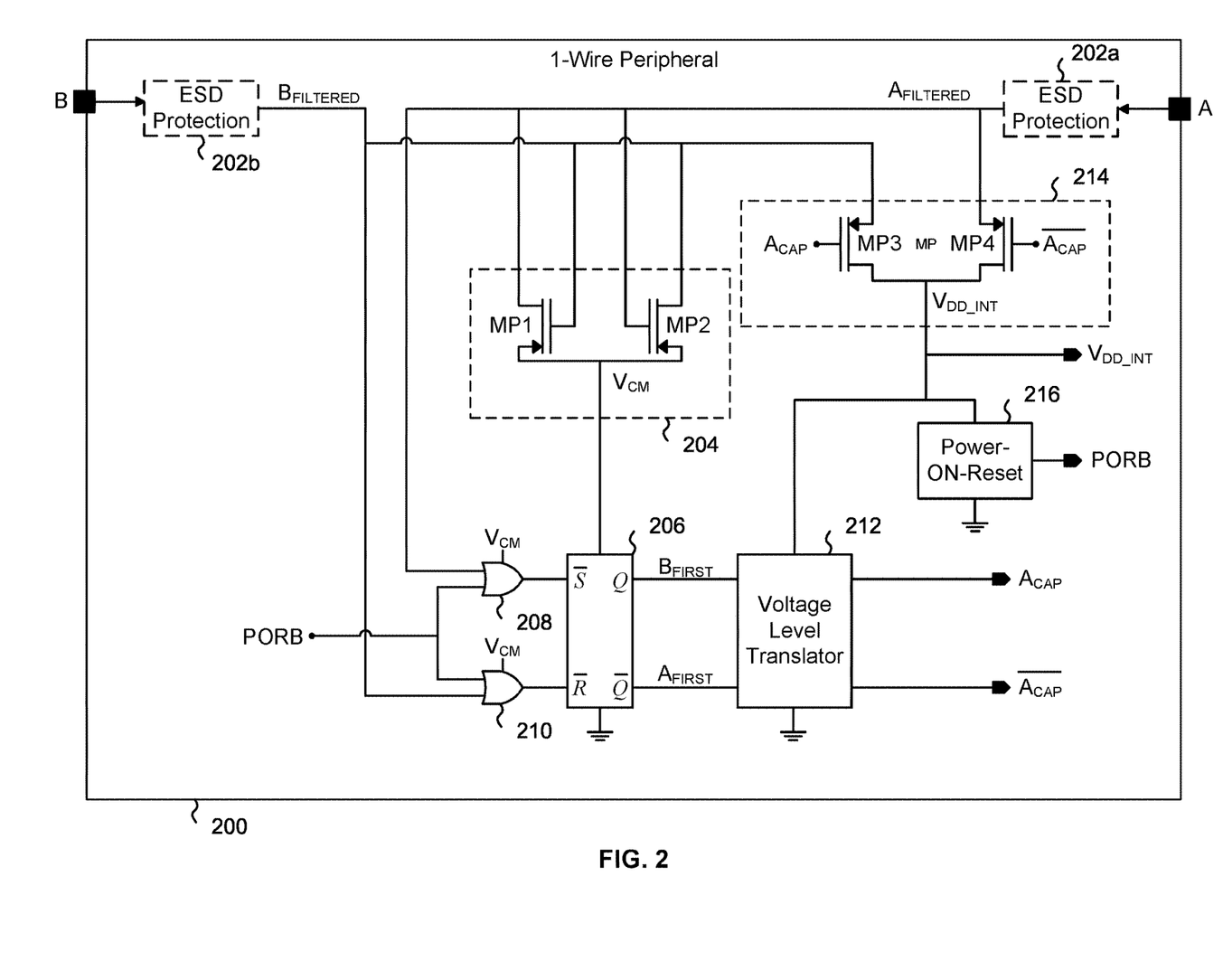
FIG. 2 is a schematic diagram of a single-conductor peripheral having swappable pins A and B, either of one of which may be used as either an I/O pin or a CAP pin.

FIG. 2 is a schematic diagram of a single-conductor peripheral 200 having swappable pins A and B, either of one of which may be coupled to an I/O line or a CAP line. For example, in a first configuration, pin A may be the I/O pin while pin B may be the CAP pin. In a second configuration, pin B may be the I/O pin while pin A may be the CAP pin. In the illustrated example, with pins A and B on opposite sides of the peripheral 200 layout, the peripheral 200 may be used as either a "left-handed" or a "right-handed" embodiment.

The illustrated circuitry of the peripheral 200 performs the following functions: detecting the initial phase of device startup; determining which of pins A and B is coupled to an I/O line like the 1-Wire bus (and thus is the I/O pin), and which of pins A and B is coupled to the storage capacitor C (and thus is the CAP pin); and generating a flag signal indicating that determination, which may be used by other circuitry within the peripheral. Detection of pin characteristics is determined at device startup by latching a logic signal to represent the fastest rising signal on the lines (I/O and CAP) coupled to pins A and B, flagging that latched signal line as being the I/O line, and preventing further changes to the latch output until the next startup cycle.

In the illustrated example, each of pins A and B is coupled to a respective optional secondary electrostatic discharge (ESD) protection circuit 202a, 202b. Many 1-Wire peripherals include a primary ESD protection circuit (not shown). However, in some applications, including the secondary ESD protection circuits 202a, 202b is shown to enhance protection for gated inputs within the peripheral 200 from ESD events. The secondary ESD protection circuits 202a, 202b may be any suitable ESD circuit, including a transient voltage suppression diode or a Zener diode. Note that while the secondary ESD protection circuits 202a, 202b are shown in a series configuration interposed between a respective pin A, B and the remaining circuitry in the peripheral 200, in many cases the secondary ESD protection circuits 202a, 202b may be coupled in a shunt configuration to the signal lines emanating from the A and B pin into the peripheral 200.

If secondary ESD protection circuits 202a, 202b are included in the peripheral 200, their respective output comprises filtered versions $A_{FILTERED}$, $B_{FILTERED}$ of the signals applied to the corresponding A and B pins. For purposes of this disclosure, it is assumed that the secondary ESD protection circuits 202a, 202b are present and have a shunt configuration, and accordingly reference will be made to the filtered versions $A_{FILTERED}$, $B_{FILTERED}$ of the signals applied to the corresponding A and B pins. If the secondary ESD protection circuits 202a, 202b are not used in a particular embodiment, then references to $A_{FILTERED}$ and $B_{FILTERED}$ should be taken as being the respective signals applied to the corresponding A and B pins.

A MAX A/B circuit 204 provides an output voltage $V_{CM}$ that is the greater of $A_{FILTERED}$ or $B_{FILTERED}$, thus effectively filtering out excursions in voltage on either line (e.g., from signaling on the I/O line) and providing a continuous power supply to an active-LOW Set-Reset (S'R') latch 206 and associated OR gates 208 and 210. The MAX A/B circuit 204 in the illustrated example includes a first P-type MOSFET (PFET) MP1 having a conduction channel (between drain and source) coupled to the $A_{FILTERED}$ line and a gate coupled to the $B_{FILTERED}$ line, as well as a second PFET MP2 having a conduction channel coupled to the $B_{FILTERED}$ line and a gate coupled to the $A_{FILTERED}$ line. The sources of MP1 and MP2 are coupled together and provide $V_{CM}$ to power the S'R' latch 206 when $B_{FILTERED} < A_{FILTERED}$ ($V_{CM}$ is based on power through MP1 from the $A_{FILTERED}$ line) or when $B_{FILTERED} > A_{FILTERED}$ ($V_{CM}$ is based on power through MP2 from the $B_{FILTERED}$ line). The result is that the S'R' latch 206 can be quickly powered at startup of the peripheral 200 by the I/O and CAP signal lines coupled to respective ones of the A and B pins.

In the illustrated example, the S'R' latch 206 is configured to receive $A_{FILTERED}$ at an $\overline{S}$ input through a SET OR gate 210, and to receive $B_{FILTERED}$ at an $\overline{R}$ input through a RESET OR gate 210. The S'R' latch 206 is designed to start in a balanced state at startup (i.e., both Q and $\overline{Q}$ are low before startup) and flips one way or the other based on the inputs from the $A_{FILTERED}$ and $B_{FILTERED}$ lines. Of course, the inputs to S'R' latch 206 may be reversed if logic adjustments are made as to the meaning of the Q and $\overline{Q}$ outputs.

Figure 3:
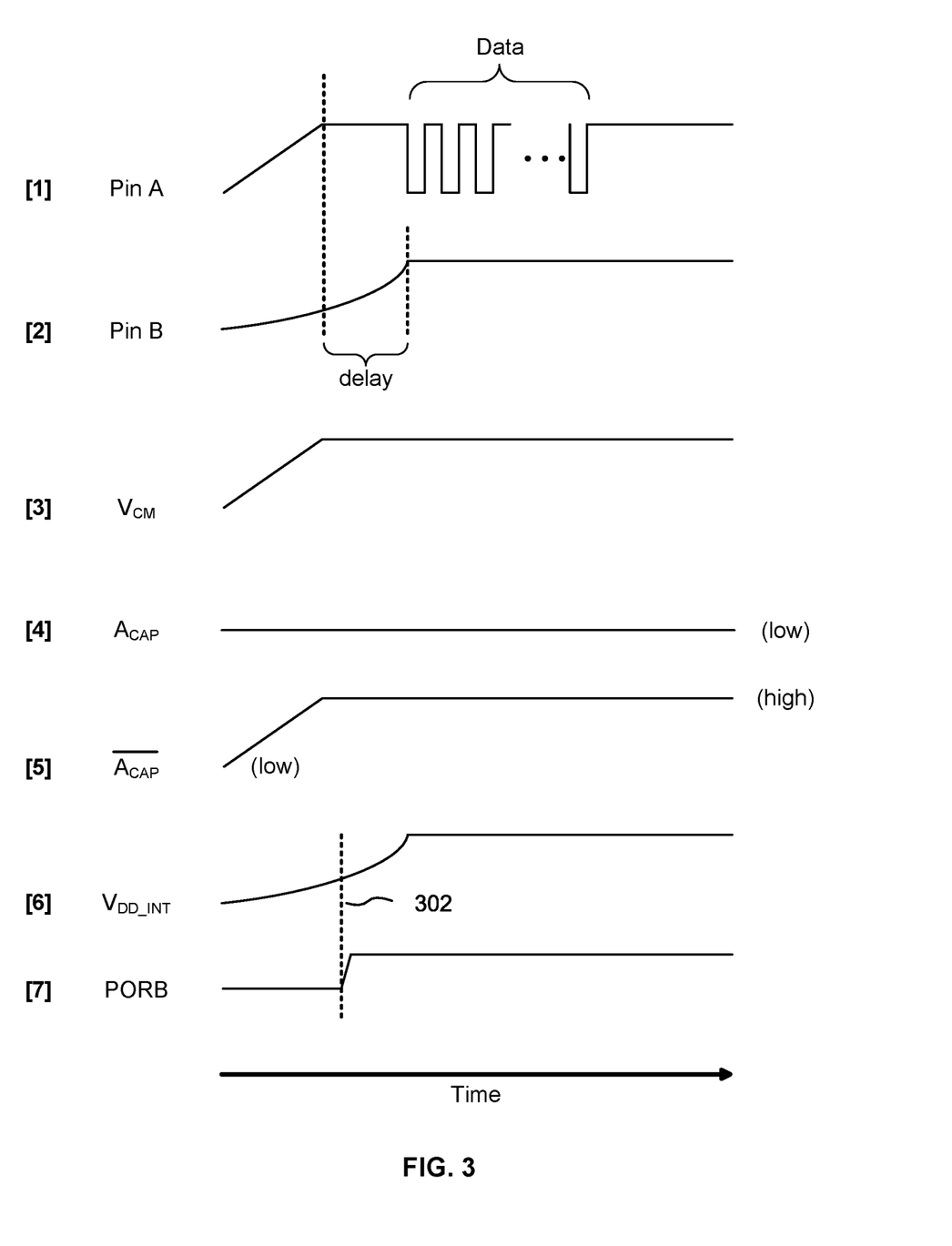
FIG. 3 is a set of voltage signals [1]-[7] as a function of time for various nodes within the example circuit shown in FIG. 2.

FIG. 3 is a set of voltage signals [1]-[7] as a function of time for various nodes within the example circuit shown in FIG. 2 (note that the amplitude of any voltage signal may be on a different scale than other voltage signals). During startup of the peripheral 200, it is assumed that the voltage on the CAP line (coupled to one of pins A and B) will be significantly lower during initial startup than the voltage on the I/O line (coupled to the other one of pins A and B), owing to the time it takes for the relatively large storage capacitor C to charge fully (keeping in mind that the storage capacitor C generally would have no charge at startup). Assuming that pin A is coupled to the I/O line and pin B is coupled to the CAP line, then voltage signals [1] and [2] show the relative rise in voltage as a function of time for an I/O signal (voltage signal [1]) versus the voltage on the CAP line (voltage signal [2]). Concurrently, $V_{CM}$ will "follow" the greater of the voltage signals applied to either pin A or pin B (see voltage signal [3] in FIG. 3), and thus will rise when the I/O line rises (on pin A in this example). Note that if pin A is coupled to the CAP line and pin B is coupled to the I/O line, then voltage signals [1] and [2] will be swapped but voltage signal [3] will remain the same.

As should be clear from FIG. 3, the I/O line signal on pin A will reach a HIGH level before the delayed CAP line signal on pin B. That delay difference means that the $B_{FILTERED}$ signal (corresponding to the CAP line in this example) at the $\overline{R}$ input will still be LOW when the $A_{FILTERED}$ signal (corresponding to the I/O line in this example) at the $\overline{S}$ input reaches a HIGH level. Accordingly, the Q output (the $B_{FIRST}$ signal) of the S'R' latch 206 will be LOW and the $\overline{Q}$ output (the $A_{FIRST}$ signal) will be HIGH (meaning pin A is coupled to the I/O line and pin B is coupled to the CAP line). The belated rise of the $B_{FILTERED}$ signal from LOW to HIGH will not change the output of the S'R' latch 206. As discussed below, a Power-ON Reset signal PORB is eventually applied to the SET OR gate 210 and the RESET OR gate 210 to prevent any data signal transitions on the I/O line from altering the output state of the S'R' latch 206.

In many applications, it is advisable to utilize a logic level translator 212 to translate the voltage levels output by the S'R' latch 206 to levels compatible with the internal voltage supply $V_{DD\_INT}$ from a supply switch circuit (see details below), and more specifically from the range of 0V-$V_{CM}$ to the range 0V-$V_{DD\_INT}$. In the illustrated example, the logic level translator 212 voltage translates the output signals from the S'R' latch 206. If $A_{FIRST}$=HIGH and $B_{FIRST}$=LOW, then the logic level translator 212 will output $A_{CAP}$=LOW and $\overline{A_{CAP}}$=HIGH (meaning that the CAP line is not coupled to pin A, but rather is coupled to pin B); see voltage signals [4] and [5] in FIG. 3. Conversely, assuming that pin A is coupled to the CAP line and pin B is coupled to the I/O line, then the logic level translator 212 will output $A_{CAP}$=HIGH and $\overline{A_{CAP}}$=LOW (meaning that the CAP line is coupled to pin A).

The $A_{CAP}$ and $\overline{A_{CAP}}$ signals are coupled to a supply switch circuit 214, and more specifically to respective gates of PFETs MP3 and MP4. The conduction channel of MP3 is coupled to pin B and the conduction channel of MP4 is coupled to pin A (note that MP3 and MP4 are typically tied directly to pins A and B, not $A_{FILTER}$ and $B_{FILTER}$; if the secondary ESD protection circuits 202a, 202b are shunt circuits—assumed to be the case in the illustrated example—then A=$A_{FILTER}$ and B=$B_{FILTER}$). The drains of MP3 and MP4 are coupled and comprise an internal voltage supply $V_{DD\_INT}$ output.

At startup, the $A_{CAP}$ and $\overline{A_{CAP}}$ signals will be at 0V, so both PFETs MP3 and MP4 will be ON (conducting) since the respective gates of MP3 and MP4 will be negative relative to their respective sources. With both MP3 and MP4 ON, the I/O line (regardless of whether coupled to pin A or B) and the CAP line (again, regardless of whether coupled to pin A or B) will be coupled together. The result is that the coupled lines will provide an internal voltage supply $V_{DD\_INT}$, and voltage on the I/O line will begin to charge the storage capacitor C through the CAP line. Of note, one of the PFETs MP3 and MP4 will transition to an OFF (blocking) state when the corresponding signal applied to the respective gate switches to HIGH. Thus, if $A_{CAP}$=HIGH, then MP3 will turn OFF, and conversely, if $\overline{A_{CAP}}$=HIGH, then MP4 will turn OFF.

As voltage signal [6] in FIG. 3 indicates, the internal voltage supply $V_{DD\_INT}$ takes some time to rise to its highest level, owing to the time it takes for the relatively large storage capacitor C to charge fully and due to the capacitance of other circuits (not all shown) coupled to the internal voltage supply $V_{DD\_INT}$.

TABLE 1 below summarizes the input and output states of the S'R' latch 206:

TABLE 1

| S' | R' | Q | $\overline{Q}$ |
|---|---|---|---|
| 0 | 0 | undefined | undefined |
| 0 | 1 | 1 | 0 |
| 1 | 0 | 0 | 1 |
| 1 | 1 | no change to prior state of output | |

TABLE 2 below summarizes the function of the illustrated peripheral 200:

TABLE 2

| S'R' Latch Inputs | Pin A | Pin B | $A_{CAP}$ | $\overline{A_{CAP}}$ |
|---|---|---|---|---|
| If Pin A rises faster than Pin B | I/O line | CAP line | LOW | HIGH |
| If Pin B rises faster than Pin A | CAP line | I/O line | HIGH | LOW |

If a logic level translator 212 is not needed, then the $A_{FIRST}$ and $B_{FIRST}$ signals may be applied to the gates of the PFETs MP3 and MP4 in place of the $\overline{A_{CAP}}$ and $A_{CAP}$ signals, respectively (possibly with a buffer or inverter in between if needed to drive MP3 and MP4).

The internal voltage supply $V_{DD\_INT}$ is coupled to a conventional Power-ON-Reset (POR) circuit 216. The POR circuit 216 provides a predictable, regulated voltage after the initial application of power to the peripheral 200. Once the internal voltage supply $V_{DD\_INT}$ rises above a selected threshold or "Power Good" level (see dotted line 302 superimposed on voltage signal [6] in FIG. 3), an output logic signal PORB of the POR circuit 216 will rise from 0V (in startup condition) to a HIGH state ($\approx V_{DD\_INT}$); see voltage signal [7] in FIG. 3. At this point, application of the HIGH state of PORB to the SET OR gate 210 and the RESET OR gate 210 prevents any post-startup data signal transitions on the I/O line from altering the output state of the S'R' latch 206 (see signal line [1] in FIG. 3 for an example of data signal transitions on the I/O line).

As should be clear, either of $A_{CAP}$ or $\overline{A_{CAP}}$ comprise flag signals that may be used to indicate which of pin A or B is coupled to the I/O line and the CAP line, and thus may be used by other circuitry within the peripheral 200 to control behavior. For example, assertion of $A_{CAP}$=LOW may cause other circuitry to treat pin A as being coupled to the I/O line (e.g., the 1-Wire bus), and conversely, assertion of $A_{CAP}$=HIGH may cause such other circuitry to treat pin B as being coupled to the I/O line. A multiplexer or the like can be used to selectively connect such other circuitry (e.g., an input buffer 122 or an open-drain output transistor Mx for transmissions) to pin A or pin B using either of the $A_{CAP}$ or $\overline{A_{CAP}}$ signals as a selector bit. As another example, the state of either of the $A_{CAP}$ or $\overline{A_{CAP}}$ signals may be used to define an ID for the peripheral 200—for example, if $A_{CAP}$ is LOW, then the ID may have first value, while if $A_{CAP}$ is HIGH, then the ID may have second value. In any case, the supply switch 214 will provide the internal voltage supply $V_{DD\_INT}$ to other circuitry regardless of whether the CAP line is coupled to pin A or pin B.

Embodiment Details

Figure 4:
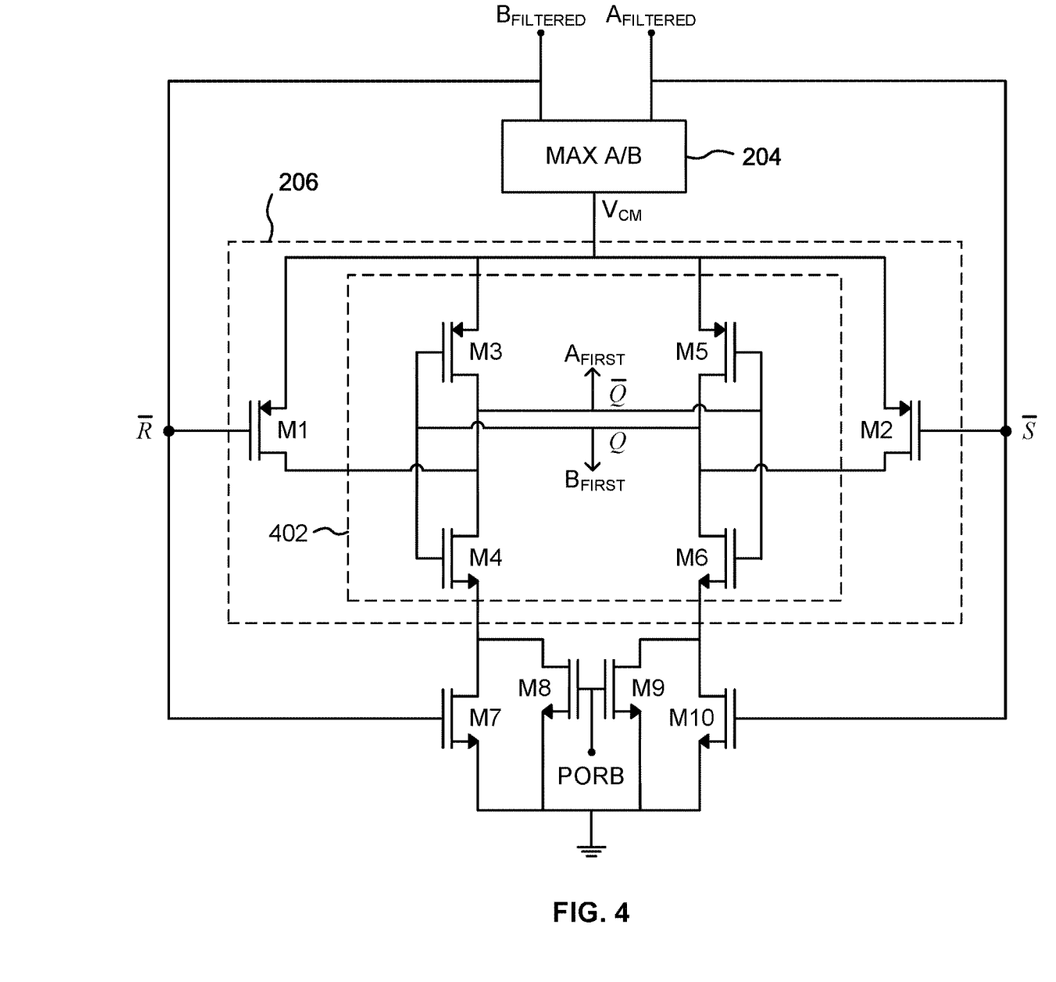
FIG. 4 is a schematic diagram of one embodiment of an S'R' latch and associated SET OR gate and RESET OR gate that may be used in the peripheral of FIG. 2.

FIG. 4 is a schematic diagram of one embodiment of an S'R' latch 206 and associated SET OR gate and RESET OR gate that may be used in the peripheral 200 of FIG. 2. Power to the S'R' latch 206 is provided by the MAX A/B circuit 204 as described above. The SET OR gate 208 of FIG. 2 comprises PFET M2 and NFETs M9 and M10, while the RESET OR gate 210 of FIG. 2 comprises PFET M1 and NFETs M7 and M8. A set of four FETs (PFET M3, NFET M4, PFET M5, and NFET M6) comprise a conventional latch core 402 for the active-LOW S'R' latch.

In the example embodiment of FIG. 4, PFETs M1 and M2 can be made relatively weak (i.e., having a relatively high ON resistance $R_{ON}$) devices which cannot flip the latch on their own (i.e., M7 and M8 or M9 and M10 would both have to be OFF). More conventionally, a second PFET could be added above or below both M1 and M2 and connected to PORB. However, the use of "weak" devices for PFETs M1 and M2 saves at least two relatively large transistor devices.

During startup, PFET M2 and NFET M10 are controlled by the $A_{FILTERED}$ signal and force the latch core 402 to the Set state if $B_{FILTERED}$>$A_{FILTERED}$—thus, the Q output (the $B_{FIRST}$ signal) of the latch core 402 will be HIGH and the $\overline{Q}$ output (the $A_{FIRST}$ signal) will be LOW (meaning pin B is coupled to the I/O line and pin A is coupled to the CAP line). Similarly, during startup, PFET M1 and NFET M7 are controlled by the $B_{FILTERED}$ signal and force the latch core 402 to the Reset state if $A_{FILTERED}$>$B_{FILTERED}$—thus, the Q output (the $B_{FIRST}$ signal) of the latch core 402 will be LOW and the $\overline{Q}$ output (the $A_{FIRST}$ signal) will be HIGH (meaning pin A is coupled to the I/O line and pin B is coupled to the CAP line).

Once communications on the I/O line starts, resulting in the (now determined) I/O pin dropping at times to 0V, the S'R' latch 206 remains operational because $V_{CM}$ will still be supplied by the MAX A/B circuit 204 (because the CAP line is HIGH), and only PFETs M1 and M2 can affect the state of the latch core 402. If M1 and M2 are chosen as relatively weak devices with respect to other devices within the circuit, the S'R' latch 206 cannot change state until the next startup cycle. Alternately, additional transistor devices can be placed above or below M1 and M2 with gates tied to PORB.

As should be clear to one of ordinary skill in the art, the functions of the latch core 402 and the controlling SET 208 and RESET 210 gates may be implemented with other specific devices and/or circuit configurations without departing from the teachings of this disclosure.

Figure 5:
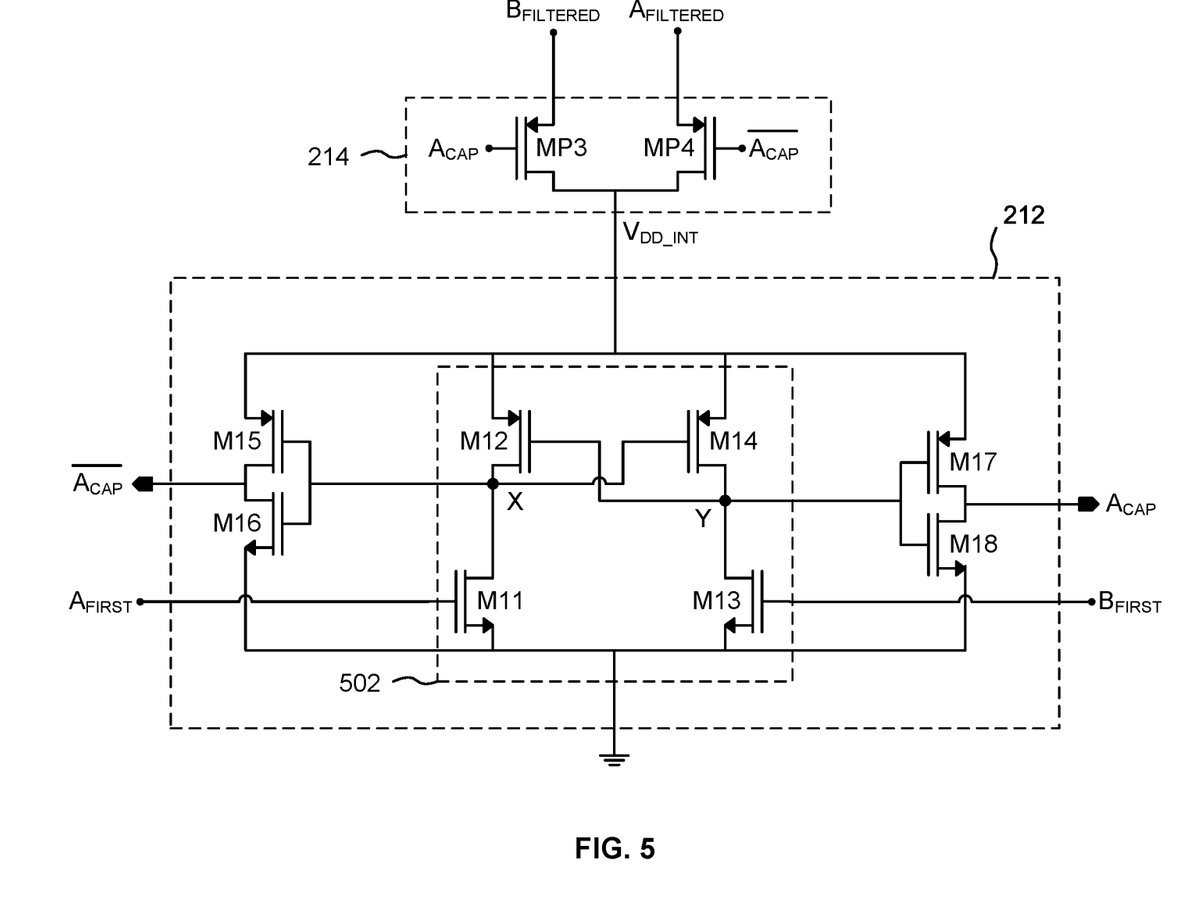
FIG. 5 is a schematic diagram of one embodiment of a logic level translator that may be used in the peripheral of FIG. 2.

FIG. 5 is a schematic diagram of one embodiment of a logic level translator 212 that may be used in the peripheral 200 of FIG. 2. The supply switch circuit 214 described above provides $V_{DD\_INT}$ to the logic level translator 212. A set of four FETs (NFET M11, PFET M12, NFET M13, and PFET M14) comprise a level translation core 502 that translates the voltage of inputs $A_{FIRST}$ and $B_{FIRST}$ from the range of 0V-$V_{CM}$ to the range 0V-$V_{DD\_INT}$ in known fashion, resulting in inverted voltage translated outputs at nodes X and Y, respectively. PFET/NFET pairs M15, M16 and M17, M18 each comprise inverters that invert the signals at nodes X and Y, resulting in the $A_{CAP}$ and $\overline{A_{CAP}}$ signals described above.

As should be clear to one of ordinary skill in the art, the functions of the level translation core 502 and inverters within the logic level translator 212 may be implemented with other specific devices and/or circuit configurations without departing from the teachings of this disclosure.

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 6:
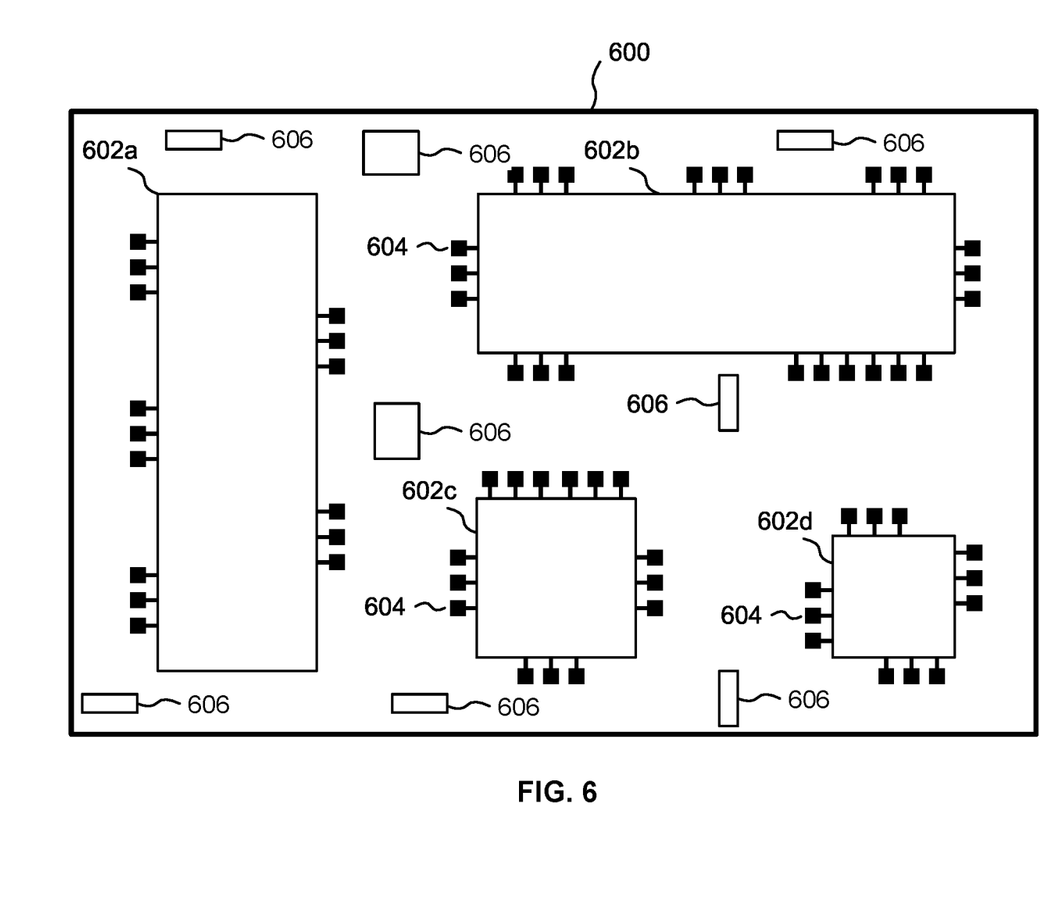
FIG. 6 is a top plan view of a substrate that may be, for example, a printed circuit board or chip module substrate (e.g., a thin-film tile).

As one example of further integration of embodiments of the present invention with other components, FIG. 6 is a top plan view of a substrate 600 that may be, for example, a printed circuit board or chip module substrate (e.g., a thin-film tile). In the illustrated example, the substrate 600 includes multiple ICs 602a-602d having terminal pads 604 which would be interconnected by conductive vias and/or traces on and/or within the substrate 600 or on the opposite (back) surface of the substrate 600 (to avoid clutter, the surface conductive traces are not shown and not all terminal pads are labelled). The ICs 602a-602d may embody, for example, temperature sensors, humidity sensors, and other circuitry. For example, IC 602d may incorporate an instance of a single-conductor peripheral 200 like the circuit shown in FIG. 2.

The substrate 600 may also include one or more passive devices 606 embedded in, formed on, and/or affixed to the substrate 600. While shown as generic rectangles, the passive devices 606 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 600 to other passive devices 606 and/or the individual ICs 602a-602d. The front or back surface of the substrate 600 may be used as a location for the formation of other structures.

Methods

Figure 7:
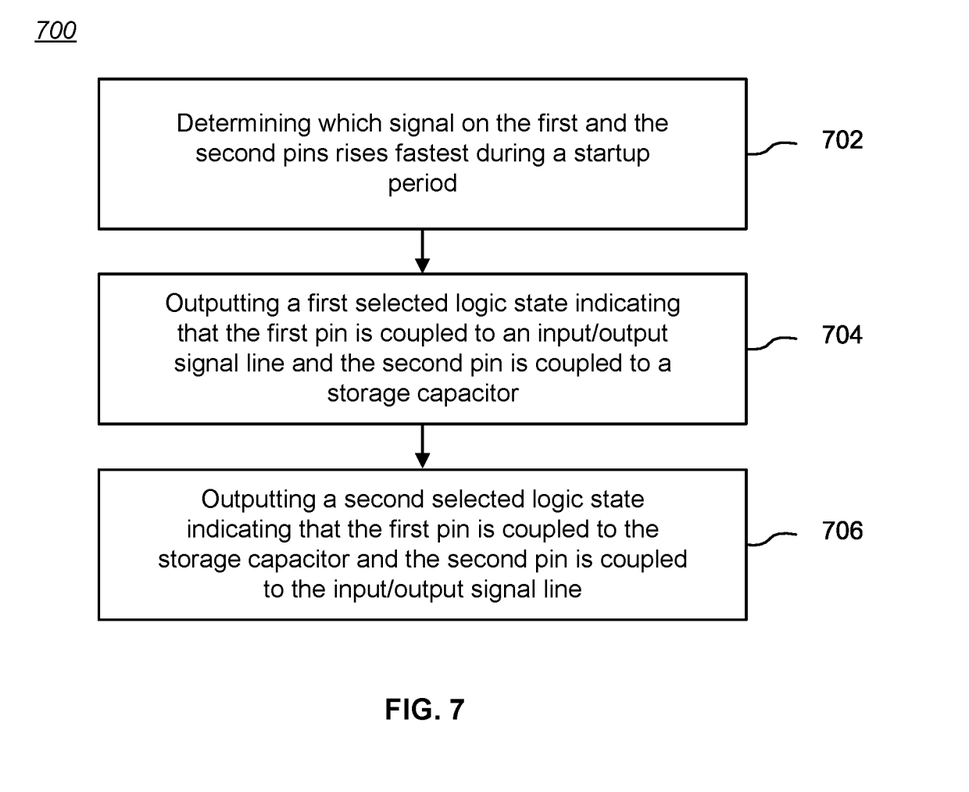
FIG. 7 is a process flow chart showing one method for determining the characteristics of respective signals on a first pin and a second pin of a peripheral configured to be coupled to a single-conductor communications bus.

Another aspect of the invention includes methods for pin determination for 1-Wire and similar single-conductor interfaces. For example, FIG. 7 is a process flow chart 700 showing one method for determining the characteristics of respective signals on a first pin and a second pin of a peripheral configured to be coupled to a single-conductor communications bus. The method includes: determining which signal on the first and the second pins rises fastest during a startup period (Block 702); outputting a first selected logic state indicating that the first pin is coupled to an input/output signal line and the second pin is coupled to a storage capacitor (Block 704); and outputting a second selected logic state indicating that the first pin is coupled to the storage capacitor and the second pin is coupled to the input/output signal line (Block 706).

Additional aspects of the above method may include one or more of the following: generating a power good indication when a voltage on an internal voltage supply output rises above a selected threshold; applying the power good indication so as to prevent alteration of the first and second selected logic states; and/or coupling a first electrostatic discharge circuit to the first pin, and a second electrostatic discharge circuit to the second pin.

Fabrication Technologies & Options

While the examples above have mostly focused on the 1-Wire system, the invention may be used with other communications bus architectures and protocols that provides data, signaling, and power over a single conductor. As should be clear to one of ordinary skill in the art, if desired, the logic levels used to control the various elements of the peripheral 200 shown in FIG. 2 may be inverted if complementary changes are made throughout; for example, the S'R' latch 206 may be implemented as an active-HIGH circuit if suitable changes are made to the input signals and output signals (e.g., by use of inverters as needed).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. When using these technologies, the term "gate" used in the disclosure above should be taken to refer to a control input, such as a gate, base, or similarly functioning element. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A circuit for determining the characteristics of respective signals on a first pin and a second pin of a peripheral configured to be coupled to a single-conductor communications bus, the circuit including a latch having first and second inputs respectively coupled to the first and the second pins, wherein the latch is configured to determine which signal on the first and the second pins rises fastest during a startup period and output a first selected logic state indicating that the first pin is coupled to an input/output signal line and the second pin is coupled to a storage capacitor, or a second selected logic state indicating that the first pin is coupled to the storage capacitor and the second pin is coupled to the input/output signal line.

2. The invention of claim 1, wherein the latch is an active-LOW set-reset latch.

3. The invention of claim 1, further including a circuit coupled to an internal voltage supply output and configured to generate a power good indication when a voltage on the internal voltage supply output rises above a selected threshold.

4. The invention of claim 3, wherein the power good indication is coupled to the first and second inputs of the latch so as to prevent alteration of the output states of the latch.

5. The invention of claim 1, further including a circuit coupled between the latch and the first and second pins, and configured to provide a voltage to the latch that is the greater of a first voltage applied to the first pin and a second voltage applied to the second pin.

6. The invention of claim 1, further including a first electrostatic discharge circuit coupled to the first pin, and a second electrostatic discharge circuit coupled to the second pin.

7. A circuit for determining the characteristics of respective signals on a first pin and a second pin of a peripheral configured to be coupled to a single-conductor communications bus, the circuit including:
(a) a first switch having a control input and having a conduction channel coupled between the first pin and an internal voltage supply output;
(b) a second switch having a control input and having a conduction channel coupled between the second pin and the internal voltage supply output; and
(c) a latch having first and second inputs respectively coupled to the first and the second pins;
wherein the latch is configured to determine which signal on the first and the second pins rises fastest during a startup period and output a first selected logic state indicating that the first pin is coupled to an input/output signal line and the second pin is coupled to a storage capacitor, or a second selected logic state indicating that the first pin is coupled to the storage capacitor and the second pin is coupled to the input/output signal line; and
wherein the first and second selected logic state outputs of the latch are coupled to respective ones of the control inputs of the first and second switches.

8. The invention of claim 7, wherein the first and second switches are PFETs.

9. The invention of claim 7, wherein the latch is an active-LOW set-reset latch.

10. The invention of claim 7, further including a voltage level translator coupled between the latch and the first and second switches and configured to translate voltages output by the latch to voltage levels compatible with voltages on the internal voltage supply output.

11. The invention of claim 7, further including a circuit coupled to the internal voltage supply output and configured to generate a power good indication when a voltage on the internal voltage supply output rises above a selected threshold.

12. The invention of claim 11, wherein the power good indication is coupled to the first and second inputs of the latch so as to prevent alteration of the output states of the latch.

13. The invention of claim 7, further including a circuit coupled between the latch and the first and second pins, and configured to provide a voltage to the latch that is the greater of a first voltage applied to the first pin and a second voltage applied to the second pin.

14. The invention of claim 7, further including a first electrostatic discharge circuit coupled to the first pin, and a second electrostatic discharge circuit coupled to the second pin.

15. A circuit for determining the characteristics of respective signals on a first pin and a second pin of a peripheral configured to be coupled to a single-conductor communications bus, the circuit including:
(a) a supply switch circuit including:
(1) a first switch having a control input and having a conduction channel coupled between the first pin and an internal voltage supply output; and
(2) a second switch having a control input and having a conduction channel coupled between the second pin and the internal voltage supply output; and
(b) a latch including:
(1) a first input coupled to the first pin;
(2) a second input coupled to the second pin;
(3) a first output coupled to the control input of the first switch and configured to be in a first logic state if a signal on the first input rises faster than a signal on the second input during a startup period, and configured to be in a second logic state if the signal on the second input rises faster than the signal on the first input during the startup period; and
(4) a second output coupled to the control input of the second switch and configured to be in the first logic state if the signal on the second input rises faster than the signal on the first input during the startup period, and configured to be in the second logic state if a signal on the first input rises faster than a signal on the second input during the startup period;
wherein the first logic state of the first output of the latch indicates that the first pin is coupled to an input/output signal line and the second pin is coupled to a storage capacitor, and wherein the second logic state of the first output of the latch indicates that the first pin is coupled to the storage capacitor and the second pin is coupled to the input/output signal line.

16. The invention of claim 15, wherein the first and second switches are PFETs.

17. The invention of claim 15, wherein the latch is an active-LOW set-reset latch.

18. The invention of claim 15, further including a voltage level translator coupled between the latch and the first and second switches and configured to translate voltages output by the latch to voltage levels compatible with voltages on the internal voltage supply output.

19. The invention of claim 15, further including a circuit coupled to the internal voltage supply output and configured to generate a power good indication when a voltage on the internal voltage supply output rises above a selected threshold.

20. The invention of claim 19, wherein the power good indication is coupled to the first and second inputs of the latch so as to prevent alteration of the output states of the latch.

21. The invention of claim 15, further including a circuit coupled between the latch and the first and second pins, and configured to provide a voltage to the latch that is the greater of a first voltage applied to the first pin and a second voltage applied to the second pin.

22. The invention of claim 15, further including a first electrostatic discharge circuit coupled to the first pin, and a second electrostatic discharge circuit coupled to the second pin.

\* \* \* \* \*